(12) United States Patent
Halik et al.

(10) Patent No.: US 6,994,805 B2
(45) Date of Patent: Feb. 7, 2006

(54) POLYTHIOPHENE POLYMER WITH HIGH CHARGE-CARRIER MOBILITIES, METHOD FOR FABRICATING THE POLYMER, AND SEMICONDUCTOR COMPONENT AND ORGANIC FIELD EFFECT TRANSISTOR INCLUDING THE POLYMER

(75) Inventors: Marcus Halik, Erlangen (DE); Günter Schmid, Hemhofen (DE)

(73) Assignee: Infineon Technologies AG, Munich (DE)

( * ) Notice: Subject to any disclaimer, the term of this patent is extended or adjusted under 35 U.S.C. 154(b) by 335 days.

(21) Appl. No.: 10/281,807

(22) Filed: Oct. 28, 2002

(65) Prior Publication Data

US 2003/0127642 A1 Jul. 10, 2003

(30) Foreign Application Priority Data

Oct. 26, 2001 (DE) .................................. 101 52 939

(51) Int. Cl.
*H01B 1/12* (2006.01)
(52) U.S. Cl. .................................................... 252/500
(58) Field of Classification Search ............... 252/500; 528/373, 377
See application file for complete search history.

(56) References Cited

U.S. PATENT DOCUMENTS

| | | | | |
|---|---|---|---|---|
| 5,688,873 | A | * 11/1997 | Saida et al. .................. | 525/410 |
| 6,120,940 | A |   9/2000 | Poehler et al. | |
| 6,166,172 | A | * 12/2000 | McCullough et al. ....... | 528/380 |
| 6,242,561 | B1 | *  6/2001 | Mohwald et al. ........... | 528/377 |
| 6,351,370 | B1 | *  2/2002 | Konuma et al. ............. | 361/523 |
| 6,585,914 | B2 | *  7/2003 | Marks et al. ................ | 252/500 |

FOREIGN PATENT DOCUMENTS

EP    0 643 118 A1    3/1995

OTHER PUBLICATIONS

J.M. Bureau et al.: "Influence of 3-4 substitutions on properties of five-membered polyheterocycles", Mol. Cryst. Liq. Cryst., 1985, 118(1-4), 235-9, cited as Chemical Abstract 1985:158731.
Mitsuru Ueda et al.: "Synthesis of poly(3-phenyl-2,5-thiphene) by nickel-catalyzed coupling polymerization of 3-phenyl-2,5-dichlorothiophene", Macromolecules, 1991, 24(10), 2694-7, cited as Chemical Abstract 1991:207968.
Q. Pei et al.: "Poly[3-(4-octylphenyl0thiopene], a new processible conducting polymer", macromolecules, 1992, 25(17), 4297-301, cited as Chemical Abstract 1992:490900.
Richard D. McCullough et al.: "Design, Synthesis, and Control of Conducting Polymer Architectures: Structurally Homogeneous Poly(3-alkythiophenes)", J. Org. Chem., 1993, vol. 58, pp. 904-912.
Peter Bäuerle et al.: "Selective Synthesis of α-Substituted Oligothiophenes", Synthesis, Nov. 1993, pp. 1095-1103.

(Continued)

*Primary Examiner*—Mark Kopec
(74) *Attorney, Agent, or Firm*—Laurence A. Greenberg; Werner H. Stemer; Ralph E. Locher (57) ABSTRACT

A polythiophene polymer with high charge-carrier mobilities, a method for fabricating the polymer, and a semiconductor component and an organic field effect transistor including the polymer are provided. The polymer has electrical semiconductor characteristics and includes a backbone formed from thiophene groups. The thiophene groups carry a side group in the $3^{rd}$ and $4^{th}$ positions that can itself have semiconductor characteristics. The polymers have a high mobility of the charge carriers and are therefore suitable for fabricating electronic components such as field effect transistors.

76 Claims, 2 Drawing Sheets

OTHER PUBLICATIONS

Douglas J. Guerrero et al.: "Preparation and Characterization of Poly(3-arylthiophene)s", Chem. Mater., 1994, 6(8), 1437-1343, cited as Chemical Abstract 1994:534929.

M.R. Andersson et al.: "Regioselective polymerization of 3-(4-octylphenyl)thiopene with FeCl3", Macromolecules, 1994, 27(22), 6503-6, cited as Chemical Abstract 1994: 631447.

Richard D. McCullough et al.: Self-Assembly and Disassembly of Regioregular, Water Soluble Polythiophenes: Chemoselective Ionchromatic Sensing in Water, J. Am. Chem. Soc., 1997, vol. 119, pp. 633-634.

C.D. Sheraw et al.: "Fast Organic Circuits on Flexible Polymeric Substrates", 2000 IEEE.

Chunping Xie et al.: "Regiospecific Design Strategies for 3-Arylpolythiophenes with Pendant Stable Radical Groups", Journal of Polymer Science, Part A: Polymer Chemistry, 1999, vol. 37, pp. 779-788.

M.G. Kane et al.: "Analog and Digital Circuits Using Organic Thin-Film Transistors on Polyester Substrates", IEEE Electron Device Letters, vol. 21, No. 11, Nov. 2000.

Howard E. Katz et al.: "Synthetic Chemistry for Ultrapure, Processable, and High-Mobility Organic Transistor Semiconductors", Acc. Chem. Res., 2001, vol. 34, pp. 359-369.

Teruaki Hayakawa et al.: "Formation of Regioregular Head-to-Tail Poly[3-(4-butylphenyl)thiopene] by an Oxidative Coupling Polymerization with Vanadium Acetylacetonate", Journal of Polymer Science, Part A: Polymer Chemistry, 2001, vol. 39, pp. 2287-2295.

Takakazu Yamamoto et al.: "$\pi$-Conjugated Soluble and Fluorescent Poly(thiophene-2,5-diyl)s with Phenolic, Hindered Phenolic and p-$C_6H_4OCH_3$ Substituents. Preparation: Optical Properties, and Redox Reaction", Journal of Polymer Science, Part A: Polymer Chemistry, 1997, vol. 35, pp. 463-474.

Eric Naudin et al.: "Poly(3-arylthiophenes): Syntheses of Monomers and Spectroscopic and Electrochemical Characterization of the Corresponding Polymers", Chemistry of Materials, 2001, 13(2), 634-642, cited as Chemical Abstract 2001:64385.

* cited by examiner

POLYTHIOPHENE POLYMER WITH HIGH CHARGE-CARRIER MOBILITIES, METHOD FOR FABRICATING THE POLYMER, AND SEMICONDUCTOR COMPONENT AND ORGANIC FIELD EFFECT TRANSISTOR INCLUDING THE POLYMER

BACKGROUND OF THE INVENTION

Field of the Invention

The invention relates to a polymer with electrical semiconductor properties, a method for producing such a polymer, and a semiconductor component containing such a polymer, and to a method for producing the semiconductor component.

Semiconductor chips have found widespread use in a variety of technical applications. But their fabrication remains a costly and intensive process. Silicon substrates can be thinned to very small layer thicknesses in order to be made flexible. However, these methods are likewise expensive. Therefore, flexible or bent microchips are suitable only for highly demanding applications in which higher costs can be accepted. Utilizing organic semiconductors makes possible a cost-effective fabrication of microelectronic semiconductor circuits on flexible substrates. For instance, one application is a thin film with integrated control elements for liquid crystal screens. Another field of application is transponder technology, where information about a product is stored on what are known as tags.

Organic semiconductors can be easily structured by printing processes, for instance. However, the application of these organic semiconductors is still limited at present by the low mobility of the charge carriers in the organic polymer semiconductors. This presently stands at 1 to 2 $cm^2/Vs$ at most. The maximum working frequency of transistors, and thus of the electronic circuit, is limited by the mobility of the charge carriers (holes or electrons). Mobilities on the order of $10^{-1}$ $cm^2/Vs$ are sufficient for driver applications in the fabrication of TFT active matrix displays. Organic semiconductors are not yet suitable for high-frequency applications. A wireless information transmission (RF-ID systems) can only be achieved above a defined minimum frequency for technical reasons. In systems that draw their energy directly from the electromagnetic alternating field and that, therefore, lack their own voltage supply, carrier frequencies of 125 kHz and 13.56 MHz, respectively, are common. Such systems are utilized for identifying or marking objects in smartcards, ID tags, or electronic postage stamps, for example. Methods in which semiconductive molecules such as pentazane or oligothiophene can be deposited optimally systematically have been developed for the purpose of improving the charge carrier transport in organic semiconductors. This can be achieved by vacuum sublimation, for example. Systematic depositing of the organic semiconductor increases the crystallinity of the semiconductor material. The energy barriers for the charge carrier transport can be lowered by the improved—overlap between the molecules, i.e. between the side chains. By substituting blocking groups for the semiconductive molecule units, domains with liquid-crystalline properties can be generated in the deposition of the organic semiconductor from the liquid or gas phase. Beyond this, synthesis techniques have been developed in which an optimally high regio-regularity is achieved in polymers through the utilization of asymmetrical monomers.

Electrically semiconductive polymers are needed in field effect transistors or electronic components based on a field effect. This type of configuration is described in M. G. Kane et al., *IEEE Electron Device Letters*, Vol. 21, No. 11 (2000), p. 534; or D. J. Gundlach et al., 1999 *International Electron Devices Meeting* (December 1999)

In order to apply organic polymers in field effect transistors or similar electronic components, the polymer must behave like an insulator when there is no electrical field, and must exhibit semiconductor characteristics, forming a conduction channel, under the influence of an electrical field. Polyphenylenes or polynaphthaline derivatives have such properties. But these are not processible owing to their insolubility, which means that field effect transistors cannot be fabricated with these compounds.

SUMMARY OF THE INVENTION

It is accordingly an object of the invention to provide a polythiophene polymer with high charge-carrier mobilities, a method for fabricating the polymer, and a semiconductor component and an organic field effect transistor including the polymer that overcome the hereinafore-mentioned disadvantages have a greater mobility of the charge carriers and that are suitable for fabricating organic field effect transistors.

The object is achieved by a polymer with electrical semiconductor properties with a polythiophene backbone, whereby the polymer has a structure according to Formula I:

Formula I where $R^1$, $R^2$ are each a hydrogen atom or a monovalent residue that includes a π-conjugated electron system by which the π-electron system of the polythiophene backbone is enhanced, where $HR^1$, $HR^2$ are themselves electrical semiconductors, or $R^1$, $R^2$ lend the polymer electrical semiconductor characteristics, provided that at least one of the residues $R^1$, $R^2$ is not hydrogen;

$E^1$, $E^2$ are each an arbitrary terminal group or a free electron; and n is a whole number between 1 and 1000.

The inventive polymer is derived from polythiophene, which already has semiconductor characteristics itself. The mobility of the charge carriers in the polymer can be significantly increased by attaching the lateral residues $R^1$, $R^2$. The groups $R^1$, $R^2$ acquire a defined spatial configuration relative to each other when attached to the backbone of the polymer, which includes thiophene rings. If the lateral groups $R^1$ and $R^2$ are themselves semiconductive, an additional conduction path can be opened, in which the charge carriers are transported between the residues $R^1$ and $R^2$ via a hopping mechanism. Because the residues $R^1$ and $R^2$ are chemically bonded to the thiophene-ring backbone of the polymer, a charge transport can also occur between the residues $R^1$, $R^2$ and the thiophene rings of the polymer backbone. The mobility of the charge carriers is thus substantially greater compared to the organic semiconductor materials known from the prior art. Another advantage is that amorphous regions have a high charge-carrier mobility. For this reason, the polymer does not have to exhibit a high crystallinity, such as is required for pentazene. Therefore, the method for depositing the polymer is not subject to high demands. The polymer can be deposited on the substrate with a high throughput by simple techniques, particularly printing methods, whereby good semiconductor characteristics are achieved.

In a configuration corresponding to a field effect transistor, the compounds behave like isolators absent the application of a corresponding electric field. When a corresponding electric field is applied, a conduction channel develops, and the polymer exhibits electrical semiconductor characteristics. The inventive polymers are thus well suited to the fabrication of organic field effect transistors.

The inventive organic polymers can be utilized as either p or n semiconductors. The relative position of HOMO and LUMO determines whether the inventive polymer is a p semiconductor or an n semiconductor.

Groups that are already electrically semiconductive as a free compound $HR^1$, $HR^2$ can be used as lateral groups $R^1$ and $R^2$. But the groups can also be selected such that they lend the polymers semiconductor characteristics—i.e. they are not electrically semiconductive as a free compound, but they exert a positive influence on the electrical semiconductor characteristics of the thiophene-ring backbone of the polymer via the bond thereto. Based on the structure of the lateral residue $R^1$ and $R^2$, the electrical semiconductor characteristics of the polymer can be varied over a wide range. To that extent, the structure of the lateral groups $R^1$, $R^2$ can be varied over a wide range. The groups $R^1$ and $R^2$ are formed by groups with extended aromatic or heteroaromatic electron systems. These aromatic or heteroaromatic groups can carry substitutes. The semiconductor characteristics of the polymer can be further influenced by the substitutes. Additional characteristics of the polymer, such as its solubility, can also be varied by using these substitutes.

The terminal groups $E^1$, $E^2$ can be arbitrarily selected within broad limits. The terminal groups $E^1$, $E^2$ are advantageously formed by a hydrogen atom or an alkyl group with 1 to 10 carbon atoms.

The length and molecular weight of the polymer can be influenced by the reaction conditions that are selected for its fabrication. The variable n is an integer between 1 and 1,000 depending on the chain length of the polymer. It goes without saying that a statistical distribution in the chain length of the polymer is achieved in the polymer fabrication. In this case, n references the average number of thiophene units forming the polymer backbone.

The polymer has a controlled stereochemistry of the lateral groups $R^1$, $R^2$; that is, the groups $R^1$ and $R^2$ are tactically configured in systematic fashion at the thiophene-group backbone of the polymer. In order to achieve the improved electrical semiconductor characteristics, at least one of the residues $R^1$, $R^2$ must not be hydrogen.

In a preferred group of inventive polymers with electrical semiconductor characteristics, the residues $R^1$, $R^2$ are independently selected from the following group: hydrogen and wherein
$R^3$ is a hydrogen atom, a halogen atom, or a monovalent hydrocarbon residue that can be saturated or unsaturated, and in which the hydrogen atoms can be wholly or partly replaced by fluorine atoms, and which can also be attached via an oxygen atom;
$R^4$ is a hydrogen atom or a monovalent hydrocarbon residue that can be saturated or unsaturated and in which the hydrogen atoms can be wholly or partly replaced by fluorine atoms, and that can also be attached via an oxygen atom;
$R^5$ is a hydrogen atom or a monovalent hydrocarbon residue that can be saturated or unsaturated and in which the hydrogen atoms can be wholly or partly replaced by fluorine atoms;
m is a whole number between 1 and 6; and
p is a whole number between 0 and 3.

When the residues $R^3$, $R^4$, $R^5$ represent respective hydrocarbon residues, this can be a straight-chain or branched hydrocarbon residue that preferably includes from 1 to 10 carbon atoms. Cycloalkyl groups are also suitable substitutes $R^3$, $R^4$, $R^5$, whereby these preferably include 5 to 20 carbon atoms. The monovalent hydrocarbon residue in $R^3$, $R^4$, $R^5$ can also be an aryl group. The group can include one or more aromatic rings and preferably include 6 to 20 carbon atoms. In these hydrocarbon residues, the hydrogen atoms can be wholly or partly replaced by fluorine atoms. In the residues $R^3$ and $R^4$, the hydrocarbon residue can also be bonded to the lateral groups of the inventive polymer via an oxygen atom. The residues $R^3$ and $R^4$ are then formed by alkoxy or aryloxy groups, which can likewise be partly or wholly fluorinated.

As described above, the inventive polymer includes an extremely systematic construction in order to achieve the desired high mobility of the charge carriers. Regio-selective techniques are therefore needed for the fabrication of the polymer, so that the monomers react selectively in head/tail interconnection so as to form the desired polymer. Thus, there is included in the subject matter of the invention a method for fabricating the above described polymer with electrical semiconductor characteristics, whereby a monomer according to Formula II is produced:

Formula II wherein

$R^1$, $R^2$ represent the same as above, and the compound according to Formula II is polymerized into an isotactic polymer in a regio-selective fashion.

Methods for regio-selective polymerization of monomers according to Formula II can be carried out, for instance by using a Kumada, Stille, or Suzuki coupling. These methods are described in the following: Katz, Acc. Chem. Res. 34 (2001), 359ff; McCullough, J. Org. Chem. 58 (1993) 904ff; and McCullough, J. Am. Chem. Soc. 119 (1997) 633ff.

As described above, the structure of groups $R^1$, $R^2$ can be varied within broad limits. Preferred polymers are obtained when the compound according to Formula II is selected from the following group:

-continued where $R^3$, $R^4$, $R^5$ are defined as above.

The invention also includes a semiconductor component. The semiconductor component includes an organic polymer with electrical semiconductor characteristics such as the one described above. The semiconductor component can be constructed various ways, for instance in the form of transistors or diodes. A configuration as an organic field effect transistor is preferable. The inventive semiconductor component is expediently installed on a flexible substrate. Inexpensive, flexible, transparent polymer films based on polyethylene naphthalate, polyethylene terephthalate, polyethylene, polypropylene, polystryrol, epoxy resin, polyimide, polybenzoxazole, polyether, or conductively coated variants thereof, are used for this purpose. Flexible metal films, glass, quartz, or conductively coated glasses can also be utilized as the substrate.

In order to fabricate such semiconductor components, a polymer such as the one described above is deposited on a substrate and structured. The polymer can be structured by first generating a film out of the inventive polymer and then structuring this by common photolithography techniques. The polymer film can be generated by spinning, for example. But the polymer can also be applied onto the surface of the substrate using a printing technique. Inkjet, tampon (i.e. swabbing), or serigraphy techniques are suitable. The polymer can also be adapted to offset techniques by selecting the substitutes accordingly. The conductive connections to the semiconductor layer can already be deposited on the substrate, for instance as the source or drain electrode of a field effect transistor, or they can be deposited on the polymer layer after the deposition and structuring of the polymer layer.

The inventive polymer is preferably deposited onto the substrate in the form of a solution. In principle, any organic solvent whose boiling point is lower than the decomposition temperature of the polymers and in which the compounds have a solubility of at least 0.1% by weight is a suitable solvent. Suitable solvents include chloroform, dichloromethane, tetrahydrofurane, acetone, cyclohexanone, ethylacetate, toluene, cresol, γ-butyrolactone, N-methylpyrrolidone, or dimethylformamide. After being applied to the substrate, the solvent is removed, for instance by heating, in order to obtain a semiconductor layer.

The solution of the inventive polymers can be applied to the substrate by conventional techniques, and the polymer with electrical semiconductor characteristics can he spun, sprayed or printed onto the substrate, for example.

As long as the inventive polymers have a sufficiently high vapor pressure below their decomposition temperature, the organic semiconductor layer can also be achieved by vapor deposition of the inventive polymers onto a substrate.

Other features that are considered as characteristic for the invention are set forth in the appended claims.

Although the invention is illustrated and described herein as embodied in a polythiophene polymer with high charge-carrier mobilities, a method for fabricating the polymer, and a semiconductor component and an organic field effect transistor including the polymer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
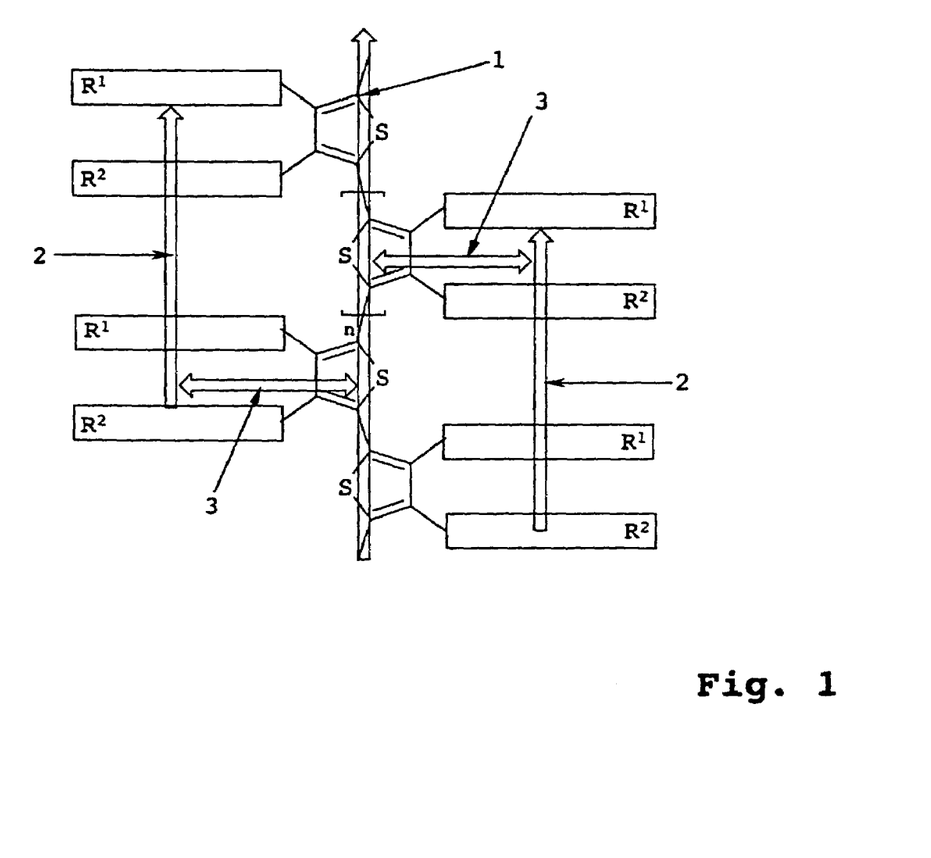
FIG. 1 is a schematic representation of charge transport paths in polymers.

Referring now to the figures of the drawings in detail and first, particularly to FIG. 1 thereof, there is shown a single polymer molecule, whereby the thiophene rings of the polymer backbone carry lateral groups $R^1$, $R^2$ which have electrical semiconductor characteristics in $3^{rd}$ and $4^{th}$ positions, respectively. Polythiophene itself is already an electrical semiconductor, and so a first charge transport path 1 extends in the inventive polymer along the thiophene-ring backbone, in which path the charge transport occurs via the $\pi$ electron system of the thiophene rings. A second charge transport path is made possible by positioning the lateral groups $R^1$, $R^2$, which assume a defined spatial configuration relative to one another. The charge transport can occur via charge transport path 2 by using a hopping mechanism along the residues $R^1$, $R^2$ that are disposed on top of one another. Because the lateral groups $R^1$, $R^2$ are covalently bonded to the thiophene-group backbone of the polymer, an exchange of the charge carriers between the charge transport path 1 and the charge transport path 2 can occur via the path 3, so that the overall mobility of the charge carriers can be increased.

Figure 2:
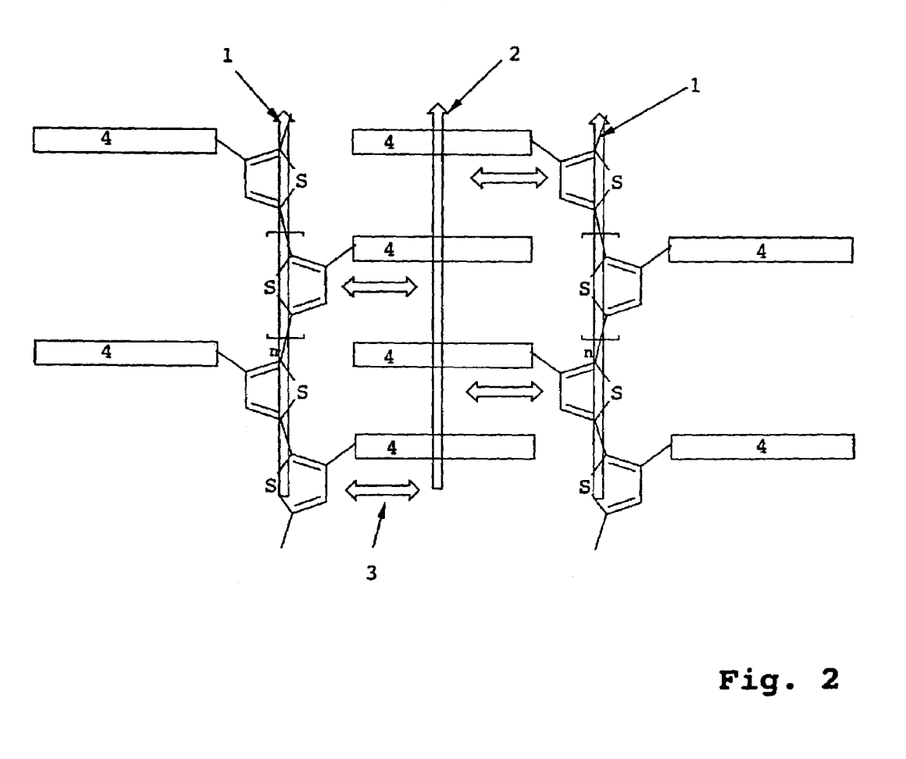
FIG. 2 is a schematic representation of charge transport paths given interaction of different inventive polymers.

The charge carrier mobility is also increased when one of the groups $R^1$, $R^2$ is a hydrogen atom. This case is schematically represented in FIG. 2. The thiophene rings carry only one lateral group 4 that exhibits semiconductor characteristics. As described in connection with the polymer represented in FIG. 1, a transport of charge carriers can occur along the charge transport path 1, which follows the thiophene-group backbone of the polymer. Neighboring polymers can interlock in such a way that the side groups 4 of the molecules are systematically disposed relative to one another. This creates a second charge transport path 2 along which the charge transport occurs by a hopping mechanism. Because the side groups 4 are bonded to the backbone of the respective polymer via a covalent bond, a charge exchange can occur between the charge transport paths 1 and 2 via path 3.

A polythiophene with an n-semiconductive character can be synthesized by selecting suitable n-semiconductive substitutes 4. This also makes it possible to produce polymers with high electron mobilities.

Synthesis of the Monomers

EXAMPLE 1

Synthesis of 5,5-dihexyl-2,2:5,2:5,3:4,2:5,2:5,2-heptathiophene (Monomer 1)

Dissolve 2.42 g (10 mmol) 3,4-dibromo-thiophene in 80 ml dry tetrahydrofurane (THF) and cool to −40° C. in an argon atmosphere. Drip in a solution of 20 mmol Grignard reagent that has been produced from 5-bromo-5-hexyl-2,2:5,2-tertthiophene (See P. Baeuerle, *Synthesis* (1993), 1099). After adding 270 mg (0.5 mmol) Ni (dppp)Cl$_2$-catalyst, heat to room temperature and then heat 70 hours under reflux. After cooling to room temperature, hydrolyze with 100 ml 1N HCl. Separate the organic phase, neutral-wash, and dry with Na$_2$SO—$_4$. Add 10 g organic silica gel, and distill off the solvent. Purify the residue with the aid of column chromatography (silica gel/toluene). 4.02 g (54%) orange powder is obtained.

EXAMPLE 2

Synthesis of 5-hexyl-2,2:5,2:5,3-quarterthiophene (Monomer 2)

Dissolve 2.42 g (10 mmol) 3-bromo-thiophene in 80 ml dry tetrahydrofurane (THF) and cool to −40° C. in an argon atmosphere. Drip in a solution of 10 mmol Grignard reagent, which has been produced from 5-bromo-5-hexyl-2,2:5,2-tertthiophene (P. Baeuerle, Synthesis 1993, 1099). After adding 135 mg (0.25 mmol) Ni(dppp)Cl$_2$-catalyst, heat to room temperature and then heat 70 hours under reflux. After cooling to room temperature, hydrolyze with 100 ml 1M HCl. Separate the organic phase, neutral-wash, and dry with Na$_2$SO—$_4$. Add 10 g organic silica gel, and distill off the solvent. Purify the residue with the aid of column chromatography (toluol over silica gel). 2.53 g (61%) yellow-orange powder are obtained.

EXAMPLE 3

Synthesis of Monomer 3

Drip a solution of 10 mmol Grignard reagent which has been produced from 5-bromo-5-hexyl-2,2:5,2:5,2:5,2:5,2-sexi(e-hexylthiophene) (analogous to P. Baeuerle, *Synthesis* (1993) 1099) into a solution of 1.21 g (5 mmol) 3,4-dibromo-thiophene in 80 ml dry tetrahydrofurane (THF) and 20 ml benzene at 40° C. in an Ar atmosphere. After adding 270 mg (0.5 mmol) Ni(dppp)Cl$_2$-catalyst, heat to room temperature and then heat 70 hours under reflux. After cooling to room temperature, hydrolyze with 100 ml 1M HCl. Separate the organic phase, neutral-wash, and dry with Na$_2$SO—$_4$. Add 10 g organic silica gel, and distill off the solvent in a vacuum. Purify the residue with the aid of column chromatography (silica gel; n-hexane/toluene—7/1). 1.46 g (13%) bright red solid are obtained.

EXAMPLE 4

Synthesis of Monomer 4

Drip a solution of 5 mmol Grignard reagent that has been produced from 5-bromo-5-hexyl-2,2:5,2:5,2:5,2:5,2-sexi(e-hexylthiophene) (analogous to P. Baeuerle, *Synthesis* (1993) 1099) into a solution of 1.21 g (5 mmol) 3-bromo-thiophene in 80 ml dry tetrahydrofurane (THF) and 20 ml benzene at −40° C. in an Ar atmosphere. After adding 135 mg (0.25 mmol) Ni(dppp)Cl$_2$-catalyst, heat to room temperature and then heat 70 hours under reflux. After cooling to room temperature, hydrolyze with 100 ml 1M HCl. Separate the organic phase, neutral-wash, and dry with Na$_2$SO—$_4$. Add 10 g organic silica gel while rotating off the solvent, and purify the residue with the aid of column chromatography (silica gel; n-hexane/toluene −5/1). 1.81 g (31%) yellow-orange powder are obtained.

EXAMPLE 5

Synthesis of Monomer 5

Stir 3.55 g (10 mmol) naphthalinetetracarboxylic acid-n-butyl-imide with 2.36 g (15 mmol) 3-aminothiophene-2-carboxylic acid methyl ester (synthesis analogous to R. D. McCullough, *J. Org. Chem.* 58 (1993) 904) for 1 h at 100° C. in an argon atmosphere while adding 1.44 g (7 mmol) dicyclohexylcarbodiimide and 5 ml chinoline. Next, heat the mixture for 15 minutes at 200° C. Boil off the raw product with 500 ml 20% $Na_2CO_3$ solution, and purify with the aid of column chromatography (silica gel; dichloromethane) after drying. 1.67 g (37%) yellow powder are obtained.

Synthesis of Monobromo Compounds

EXAMPLE 6

Synthesis of Monobromo Compound from Monomer 1

Add 0.89 g (5 mmol) N-bromosuccinimide to a solution of 3.72 g (5 mmol) monomer 1 in 50 ml DMF over a period of 10 hours at 0° C. Stir the solution another 20 hours, pour the deposit onto ice water, and extract the mixture 3 times with 100 ml dichloromethane each time. Dry the organic phases over $Na_2SO_4$, distill off the solvent in a vacuum, and purify the residue with the aid of column chromatography (silica gel; n-hexane/DCM—5/1 (Bauerele, *infra*)). 3.3 g (80%) orange powder are obtained.

Example 7

Synthesis of Monobromo Compound from Monomer 2

The synthesis occurs analogously to Example 6. 2.07 g (5 mmol) monomer 2 yield 2.02 g (82%) of yellow-orange powder.

EXAMPLE 8

Synthesis of Monobromo Compound from Monomer 3

The synthesis occurs analogously to Example 6. 1.46 g (0.65 mmol) monomer 3 yield 1.2 g (79%) of red powder.

EXAMPLE 9

Synthesis of Monobromo Compound from Monomer 4

The synthesis occurs analogously to Example 6. 1.81 g (1.5 mmol) monomer 4 yield 1.49 g (77%) of red powder.

EXAMPLE 10

Synthesis of Monobromo Compound from Monomer 5

The synthesis occurs analogously to example 6. 1.67 g (3.7 mmol) monomer 5 yield 1.63 g (83%) of yellow powder.

Synthesis of the Polymers

The polymerizing of the bromo compounds obtained in the Examples 6 to 10 is achieved by using Kumada coupling as taught by McCullough (*J. Org. Chem.* 58 (1993) 904).

EXAMPLE 11

Polymer 1

3.3 g (4 mmol) 2-bromo-monomer 1 (Example 6) yield 1.2 g of red-black polymer (Mw approx. 12,000—GPC).

EXAMPLE 12

Polymer 2

2 g (4 mmol) 2-bromo-monomer 2 (Example 7) yield 900 mg of dark-red polymer (Mw approx. 10,000—GPC).

EXAMPLE 13

Polymer 3

1.2 g (0.51 mmol) 2-bromo-monomer 3 (Example 8) yield 85 mg blue-black polymer (Mw approx. 16,500—GPC).

EXAMPLE 14

Polymer 4

1.4 g (1.1 mmol) 2-bromo-monomer 4 (Example 9) yield 430 mg of red-black polymer (MW approx. 8,500—GPC).

EXAMPLE 15

Polymer 5

2.5 g (2.8 mmol) 2-bromo-monomer 5 (Example 10) yield 360 mg of red polymer (MW approx. 13,000—GPC).

EXAMPLE 16

Producing a Substrate Solution

Any organic solvent whose boiling point is lower than the decomposition temperature of the polymers and in which the compounds have a solubility of at least 0.1 percent by mass is a suitable solvent for layer preparation, including chloroform, dichloromethane, THF, acetone, cyclohexanone, ethylacetate, toluene, cresol, γ-butyrolactone, NMP, and DMF.

Dissolve 50 mg of one of the polymers 1–5 contained in the examples 11–15 in 5 g chloroform by shaking the mixture of the two components for 1 hour in a sealed test tube on a shaking apparatus. To remove the particles, filter the solution into a steamed test tube (filter size: 0.2 μm) by pressure filtering.

EXAMPLE 17

Film Preparation (Spinning Technique)

Spin a solution prepared according to Example 12 (1000–5000 rpm, 20s, nitrogen atmosphere) onto a suitable substrate on which transistor and/or circuit structures have already been defined (e.g. Si wafer, glass, or flexible film). Dry the substrate is for 2 minutes at 80° C. under an inert gas.

EXAMPLE 18

Measuring the Charge-Carrier Mobilities

Connect a field effect transistor including a gate electrode, a gate dielectric, and palladium source and drain contacts (or aluminum contacts—polymer 5), which has been processed according to Example 17, with an analytical sampler by using metal points in an inert gas atmosphere. Measure a transistor characteristic curve with the aid of an electrical parameter measuring instrument (for example those sold under the trademark AGILENT 4156). Calculate the charge-carrier mobility from the characteristic curve. For the polymers 1–5 (Examples 11–15), the following charge carrier mobilities were determined:

Polymer 1: 0.1 cm$^2$/Vs
Polymer 2: 0.06 cm$^2$/Vs
Polymer 3: 0.65 cm$^2$/Vs
Polymer 4: 0.2 cm$^2$/Vs
Polymer 5: 0.05 cm$^2$/Vs.

What is claimed is:

1. A polymer with electrical semiconductor characteristics, comprising a polythiophene backbone having a n-electron system and a Formula I Formula I wherein
$R^1$ and $R^2$ are independently selected from the group of substituents consisting of a hydrogen atom and a monovalent residue having a n-conjugated electron system expanding said n-electron system of said polythiophene backbone;
at least one of $HR^1$ and $HR^2$ have electrical semiconductor characteristics and $R^1$ and $R^2$ lend electrical semiconductor characteristics to said Formula I, provided at least one of $R^1$ and $R^2$ is independently selected from the group consisting of -continued wherein
$R^3$ is a substituent selected from the group consisting of a hydrogen atom, a halogen atom, and a monovalent hydrocarbon residue;
$R^4$ is a substituent independently selected from the group consisting of hydrogen atom and a monovalent hydrocarbon residue;
$R^5$ is a substituent selected from the group consisting of a hydrogen atom and a monovalent hydrocarbon residue;
m is a whole number from 1 to 6; and
p is a whole number from 0 to 3;
$E^1$ and $E^2$ are independently selected from the group consisting of an arbitrary terminal group and a free electron; and
n is a whole number from 1 to 1,000.

2. The polymer according to claim 1, wherein, if $R^3$ is a monovalent hydrocarbon residue, said monovalent hydrocarbon residue is saturated.

3. The polymer according to claim 1, wherein, if $R^3$ is a monovalent hydrocarbon residue, said monovalent hydrocarbon residue is unsaturated.

4. The polymer according to claim 1, wherein, if $R^3$ is a monovalent hydrocarbon residue, said monovalent hydrocarbon residue has a hydrogen replaced by a fluorine atom.

5. The polymer according to claim 1, wherein, if $R^3$ is a monovalent, hydrocarbon residue, said monovalent hydrocarbon residue has each hydrogen replaced by a respective fluorine atom.

6. The polymer according to claim 1, further comprising an oxygen atom interconnecting said $R^3$ and said polythiophene backbone.

7. The polymer according to claim 1, wherein, if $R^4$ is a monovalent hydrocarbon residue, said monovalent hydrocarbon residue is saturated.

8. The polymer according to claim 1, wherein, if $R^4$ is a monovalent hydrocarbon residue, said monovalent hydrocarbon residue is unsaturated.

9. The polymer according to claim 1, wherein if $R^4$ is a monovalent hydrocarbon residue, said monovalent hydrocarbon residue has a hydrogen atom replaced by a fluorine atom.

10. The polymer according to claim 1, wherein if $R^4$ is a monovalent hydrocarbon residue, said monovalent hydrocarbon residue has each hydrogen atom replaced by a respective fluorine atom.

11. The polymer according to claim 1, further comprising an oxygen atom interconnecting said $R^4$ and said polythiophene backbone.

12. The polymer according to claim 1, wherein, if $R^5$ is a monovalent hydrocarbon residue, said monovalent hydrocarbon residue is saturated.

13. The polymer according to claim 1, wherein, if $R^5$ is a monovalent hydrocarbon residue, said monovalent hydrocarbon residue is unsaturated.

14. The polymer according to claim 1, wherein, if $R^5$ is a monovalent hydrocarbon residue, said monovalent hydrocarbon residue has a hydrogen replaced by a fluorine atom.

15. The polymer according to claim 1, wherein if $R^5$ is a monovalent hydrocarbon residue, said monovalent hydrocarbon residue has each hydrogen replaced by a respective fluorine atom.

16. A method for fabricating a polymer with electrical semiconductor characteristics, which comprises:
providing a monomer according to Formula II Formula II wherein $R^1$ and $R^2$ are independently selected from the group of substituents consisting of a hydrogen atom and a monovalent residue having a n-conjugated electron system expanding said n-electron system of said polythiophene backbone;
at least one of $HR^1$ and $HR^2$ have electrical semiconductor characteristics and $R^1$ and $R^2$ lend electrical semiconductor characteristics to the polymer, provided at least one of $R^1$ and $R^2$ is independently selected from the group consisting of wherein
$R^3$ is a substituent selected from the group consisting of a hydrogen atom, a halogen atom, and a monovalent hydrocarbon residue;
$R^4$ is a substituent independently selected from the group consisting of hydrogen atom and a monovalent hydrocarbon residue;
$R^5$ is a substituent selected from the group consisting of a hydrogen atom and a monovalent hydrocarbon residue;
m is a whole number from 1 to 6; and
p is a whole number from 0 to 3;
and regio-selectively polymerizing said monomer into an isotactic polymer.

17. The method according to claim 16, wherein, if $R^3$ is a monovalent hydrocarbon residue, the monovalent hydrocarbon residue is saturated.

18. The method according to claim 16, wherein, if $R^3$ is a monovalent hydrocarbon residue, the monovalent hydrocarbon residue is unsaturated.

19. The method according to claim 16, wherein, if $R^3$ is a monovalent hydrocarbon residue, the monovalent hydrocarbon residue has a hydrogen replaced by a fluorine atom.

20. The method according to claim 16, wherein, if $R^3$ is a monovalent hydrocarbon residue, the monovalent hydrocarbon residue has each hydrogen replaced by a respective fluorine atom.

21. The method according to claim 16, further comprising an oxygen atom interconnecting the $R^1$ and the polythiophene backbone.

22. The method according to claim 16 wherein, if $R^4$ is a monovalent hydrocarbon residue, the monovalent hydrocarbon residue is saturated.

23. The method according to claim 16, wherein, if $R^4$ is a monovalent hydrocarbon residue, the monovalent hydrocarbon residue is unsaturated.

24. The method according to claim 16, wherein if $R^4$ is a monovalent hydrocarbon residue, the monovalent hydrocarbon residue has a hydrogen atom replaced by a fluorine atom.

25. The method according to claim 16, wherein if $R^4$ is a monovalent hydrocarbon residue, the monovalent hydrocarbon residue has each hydrogen atom replaced by a respective fluorine atom.

26. The method according to claim 16, further comprising an oxygen atom interconnecting the $R^4$ and the polythiophene backbone.

27. The method according to claim 16, wherein, if $R^5$ is a monovalent hydrocarbon residue, the monovalent hydrocarbon residue is saturated.

28. The method according to claim 16, wherein, if $R^5$ is a monovalent hydrocarbon residue, the monovalent hydrocarbon residue is unsaturated.

29. The method according to claim 16, wherein, if $R^5$ is a monovalent hydrocarbon residue, the monovalent hydrocarbon residue has a hydrogen replaced by a fluorine atom.

30. The method according to claim 16, wherein if $R^5$ is a monovalent hydrocarbon residue, the monovalent hydrocarbon residue has each hydrogen replaced by a respective fluorine atom.

31. The method according to claim 16, wherein said isotactic polymer has a n-electron system and a polythiophene backbone having Formula I Formula I wherein
E¹ and E² are independently selected from the group consisting of an arbitrary terminal group and a free electron; and
n is a whole number from 1 to 1,000.

32. The method according to claim 16, wherein the monomer according to Formula II is selected from the group consisting of:

wherein
R³ is a substituent selected from the group consisting of a hydrogen atom, a halogen atom, and a monovalent hydrocarbon residue;
R⁴ is a substituent independently selected from the group consisting of hydrogen atom and a monovalent hydrocarbon residue;
R⁵ is a substituent selected from the group consisting of a hydrogen atom and a monovalent hydrocarbon residue;

m is a whole number from 1 to 6; and
p is a whole number from 0 to 3.

33. The method according to claim 32, wherein, if R³ is a monovalent hydrocarbon residue, said monovalent hydrocarbon residue is saturated.

34. The method according to claim 32, wherein, if R³ is a monovalent hydrocarbon residue, said monovalent hydrocarbon residue is unsaturated.

35. The method according to claim 32, wherein, if R³ is a monovalent hydrocarbon residue, said monovalent hydrocarbon residue has a hydrogen replaced by a fluorine atom.

36. The method according to claim 32, wherein, if R³ is a monovalent hydrocarbon residue, said monovalent hydrocarbon residue has each hydrogen replaced by a respective fluorine atom.

37. The method according to claim 32, further comprising an oxygen atom interconnecting said R³ and said polythiophene backbone.

38. The method according to claim 32 wherein, if R⁴ is a monovalent hydrocarbon residue, said monovalent hydrocarbon residue is saturated.

39. The method according to claim 32, wherein, if R⁴ is a monovalent hydrocarbon residue, said monovalent hydrocarbon residue is unsaturated.

40. The method according to claim 32, wherein if R⁴ is a monovalent hydrocarbon residue, a hydrogen atom of said monovalent hydrocarbon residue is replaced by a fluorine atom.

41. The method according to claim 32, wherein, if R⁴ is a monovalent hydrocarbon residue, said monovalent hydrocarbon residue has each hydrogen atom replaced by a respective fluorine atom.

42. The method according to claim 32, further comprising an oxygen atom interconnecting said R⁴ and said polythiophene backbone.

43. The method according no claim 32, wherein, if R⁵ is a monovalent hydrocarbon residue, said monovalent hydrocarbon residue is saturated.

44. The method according to claim 32, wherein, if R⁵ is a monovalent hydrocarbon residue, said monovalent hydrocarbon residue is unsaturated.

45. The method according to claim 32, wherein, if R⁵ is a monovalent hydrocarbon residue, said monovalent hydrocarbon residue has a hydrogen replaced by a fluorine atom.

46. The method according to claim 32, wherein if R⁵ is a monovalent hydrocarbon residue, said monovalent hydrocarbon residue has each hydrogen replaced by a respective fluorine atom.

47. A semiconductor component comprising an organic polymer with electrical semiconductor characteristics and including a polythiophene backbone having a n-electron system and a Formula I

Formula I wherein
R¹ and R² are independently selected from the group of substituents consisting of a hydrogen atom and a monovalent residue having a n-conjugated electron system expanding said n-electron system of said polythiophene backbone;

at least one of HR$^1$ and HR$^2$ have electrical semiconductor characteristics and R$^1$ and R$^2$ lend electrical semiconductor characteristics to said Formula I, provided at least one of R$^1$ and R$^3$ is independently selected from the group consisting of wherein
R$^3$ is a substituent selected from the group consisting of a hydrogen atom, a halogen atom, and a monovalent hydrocarbon residue;
R$^4$ is a substituent independently selected from the group consisting of hydrogen atom and a monovalent hydrocarbon residue;
R$^5$ is a substituent selected from the group consisting of a hydrogen atom and a monovalent hydrocarbon residue;
m is a whole number from 1 to 6; and
p is a whole number from 0 to 3;
E$^1$ and E$^2$ are independently selected from the group consisting of an arbitrary terminal group and a free electron; and
n is a whole number from 1 to 1,000.

48. The semiconductor component according to claim 47, wherein, if R$^3$ is a monovalent hydrocarbon residue, said monovalent hydrocarbon residue is saturated.

49. The semiconductor component according to claim 47, wherein, if R$^3$ is a monovalent hydrocarbon residue, said monovalent hydrocarbon residue is unsaturated.

50. The semiconductor component according to claim 42, wherein, if R$^3$ is a monovalent hydrocarbon residue, said monovalent hydrocarbon residue has a hydrogen replaced by a fluorine atom.

51. The semiconductor component according to claim 47, wherein, if R$^3$ is a monovalent hydrocarbon residue, said monovalent hydrocarbon residue has each hydrogen replaced by a respective fluorine atom.

52. The semiconductor component according to claim 47, further comprising an oxygen atom interconnecting said R$^3$ and said polythiophene backbone.

53. The semiconductor component according to claim 47, wherein, if R$^4$ is a monovalent hydrocarbon residue, said monovalent hydrocarbon residue is saturated.

54. The semiconductor component according to claim 47, wherein, if R$^4$ is a monovalent hydrocarbon residue, said monovalent hydrocarbon residue is unsaturated.

55. The semiconductor component according to claim 47, wherein if R$^4$ is a monovalent hydrocarbon residue, said monovalent hydrocarbon residue has a hydrogen atom replaced by a fluorine atom.

56. The semiconductor component according to claim 47, wherein if R$^4$ is a monovalent hydrocarbon residue, said monovalent hydrocarbon residue has each hydrogen atom replaced by a respective fluorine atom.

57. The semiconductor component according to claim 47, further comprising an oxygen atom interconnecting said R$^4$ and said polythiophene backbone.

58. The semiconductor component according to claim 47, wherein, if R$^5$ is a monovalent hydrocarbon residue, said monovalent hydrocarbon residue is saturated.

59. The semiconductor component according to claim 47, wherein, if R$^5$ is a monovalent hydrocarbon residue, said monovalent hydrocarbon residue is unsaturated.

60. The semiconductor component according to claim 47, wherein, if R$^5$ is a monovalent hydrocarbon residue, said monovalent hydrocarbon residue has a hydrogen replaced by a fluorine atom.

61. The semiconductor component according to claim 47, wherein if R$^5$ is a monovalent hydrocarbon residue, said monovalent hydrocarbon residue has each hydrogen replaced by a respective fluorine atom.

62. An organic field effect transistor comprising a polymer with electrical semiconductor characteristics and including a polythiophene backbone having a n-electron system and a Formula I Formula I wherein
R$^1$ and R$^2$ are independently selected from the group of substituents consisting of a hydrogen atom and a monovalent residue having a n-conjugated electron system expanding said n-electron system of said polythiophene backbone;

at least one of HR$^1$ and HR$^2$ have electrical semiconductor characteristics and R$^1$ and R$^2$ lend electrical semiconductor characteristics to said Formula I, provided at least one of R$^1$ and R$^3$ is independently selected from the group consisting of wherein
R³ is a substituent selected from the group consisting of a hydrogen atom, a halogen atom, and a monovalent hydrocarbon residue;
R⁴ is a substituent independently selected from the group consisting of hydrogen atom and a monovalent hydrocarbon residue;
R⁵ is a substituent selected from the group consisting of a hydrogen atom and a monovalent hydrocarbon residue;
m is a whole number from 1 to 6; and
p is a whole number from 0 to 3;
$E^1$ and $E^2$ are independently selected from the group consisting of an arbitrary terminal group and a free electron; and
n is a whole number from 1 to 1,000.

63. The organic field effect transistor according to claim 62, wherein, if R³ is a monovalent hydrocarbon residue, said monovalent hydrocarbon residue is saturated.

64. The organic field effect transistor according to claim 62, wherein, if R³ is a monovalent hydrocarbon residue, said monovalent hydrocarbon residue is unsaturated.

65. The organic field effect transistor according to claim 62, wherein, if R³ is a monovalent hydrocarbon residue, said monovalent hydrocarbon residue has a hydrogen replaced by a fluorine atom.

66. The organic field effect transistor according to claim 62, wherein, it R³ is a monovalent hydrocarbon residue, said monovalent hydrocarbon residue has each hydrogen replaced by a respective fluorine atom.

67. The organic field effect transistor according to claim 62, further comprising an oxygen atom interconnecting said R³ and said polythiophene backbone.

68. The organic field effect transistor according to claim 62 wherein, if R⁴ is a monovalent hydrocarbon residue, said monovalent hydrocarbon residue is saturated.

69. The organic field effect transistor according to claim 62, wherein, if R⁴ is a monovalent hydrocarbon residue, said monovalent hydrocarbon residue is unsaturated.

70. The organic field effect transistor according to claim 62, wherein if R⁴ is a monovalent, hydrocarbon residue, a hydrogen atom of said monovalent hydrocarbon residue is replaced by a fluorine atom.

71. The organic field effect transistor according to claim 62, wherein if R⁴ is a monovalent hydrocarbon residue, each hydrogen atom of said monovalent hydrocarbon residue is replaced by a respective fluorine atom.

72. The organic field effect transistor according to claim 62, further comprising an oxygen atom interconnecting said R⁴ and said polythiophene backbone.

73. The organic field effect transistor according to claim 62, wherein, if R⁵ is a monovalent hydrocarbon residue, said monovalent hydrocarbon residue is saturated.

74. The organic field effect transistor according to claim 62, wherein, if R⁵ is a monovalent hydrocarbon residue, said monovalent hydrocarbon residue is unsaturated.

75. The organic field effect transistor according to claim 62, wherein, if R⁵ is a monovalent hydrocarbon residue, said monovalent hydrocarbon residue has a hydrogen replaced by a fluorine atom.

76. The organic field effect transistor according to claim 62, wherein if R⁵ is a monovalent, hydrocarbon residue, said monovalent hydrocarbon residue has each hydrogen replaced by a respective fluorine atom.

* * * * *